US008565806B2

(12) United States Patent
Burdenski et al.

(10) Patent No.: US 8,565,806 B2
(45) Date of Patent: Oct. 22, 2013

(54) REAL TIME TRANSMISSION POWER CONTROL

(75) Inventors: Ralf Burdenski, Nuremberg (DE); David Pehlke, Austin, TX (US)

(73) Assignee: ST-Ericsson SA, Plan-les-Ouates (CH)

( * ) Notice: Subject to any disclaimer, the term of this patent is extended or adjusted under 35 U.S.C. 154(b) by 421 days.

(21) Appl. No.: 12/965,911

(22) Filed: Dec. 12, 2010

(65) Prior Publication Data

US 2012/0149423 A1 Jun. 14, 2012

(51) Int. Cl.
*H04M 1/00* (2006.01)
(52) U.S. Cl.
USPC ............... 455/522; 455/127.1; 455/67.11; 455/296; 455/114.2; 370/318
(58) Field of Classification Search
USPC ............ 455/522, 69, 126, 127.1, 13.1, 562.1, 455/63.1, 67.11–67.13, 277.1, 276.1, 296, 455/114.2, 114.3, 226.1, 245.1; 370/311, 370/318, 252
See application file for complete search history.

(56) References Cited

U.S. PATENT DOCUMENTS

| 5,369,789 | A | 11/1994 | Kosugi et al. |
| 6,091,942 | A | 7/2000 | Buer et al. |
| 6,463,295 | B1* | 10/2002 | Yun ............................... 455/522 |
| 6,633,766 | B1* | 10/2003 | van der Pol .................. 455/522 |
| 6,819,938 | B2 | 11/2004 | Sahota |
| 6,952,568 | B2* | 10/2005 | Lin .............................. 455/115.4 |
| 7,102,430 | B2 | 9/2006 | Johnson et al. |
| 7,205,842 | B2 | 4/2007 | Gustavsson et al. |
| 8,233,858 | B2* | 7/2012 | Sorrells et al. ............. 455/127.1 |
| 2002/0085647 | A1 | 7/2002 | Oishi et al. |
| 2005/0130595 | A1* | 6/2005 | Shurvinton et al. ....... 455/67.11 |
| 2006/0009163 | A1 | 1/2006 | Miura et al. |
| 2006/0239380 | A1 | 10/2006 | Khlat et al. |
| 2006/0255997 | A1* | 11/2006 | Li et al. ........................ 341/156 |

(Continued)

FOREIGN PATENT DOCUMENTS

| EP | 0 982 852 A2 | 3/2000 |
| EP | 1 478 111 A2 | 11/2004 |

(Continued)

OTHER PUBLICATIONS

3GPP Technical Specification 34.121.1, Technical Specification Group Radio Access Network; User Equipment (UE) Conformance Specification; Radio Transmission and Reception (FDD); Part 1: Conformance specification, Release 7, Version 7.6.0, Sep. 2007.

(Continued)

*Primary Examiner* — Sujatha Sharma
(74) *Attorney, Agent, or Firm* — Potomac Patent Group PLLC; Kenneth B. Leffler (57) ABSTRACT

Controlling the output power of a radio transmitter includes operating the transmitter at an initial power level setting and making an output power measurement. The measured value is adjusted by a desired incremental value and the adjusted value is then compared with the power of the original baseband signal to obtain a representation of what the gain should be if the radio transmitter power is properly adjusted to achieve the desired incremental value. The output power of the radio transmitter is than actually adjusted, and the actual gain is measured. The difference between the actual gain and the representation of what the gain should be if the radio transmitter power is properly adjusted is used to determine a further power adjustment of the radio transmitter that will reduce the difference.

20 Claims, 8 Drawing Sheets

(56) References Cited

U.S. PATENT DOCUMENTS

| | | | |
|---|---|---|---|
| 2007/0173277 A1* | 7/2007 | Yun | 455/522 |
| 2009/0196223 A1 | 8/2009 | Nalbantis et al. | |
| 2010/0265862 A1* | 10/2010 | Choi et al. | 370/311 |

FOREIGN PATENT DOCUMENTS

| | | |
|---|---|---|
| EP | 1478104 A1 | 11/2004 |
| WO | 2005/060451 A2 | 7/2005 |
| WO | 2006/115717 A2 | 11/2006 |

OTHER PUBLICATIONS

Stuhlberger, R. et al. "The Impact of RF-Impairments and Automatic Gain Control on UMTS-HSDPA-Throughput Performance" IEEE 64th Vehicular Technology Conference, Sep. 25-28, 2006, Montreal, Quebec, pp. 1-5, ISBN 1-4244-0062-7.

EPO Search Report, mailed Mar. 2, 2012, in connection with International Application No. PCT/EP2011/072429.

* cited by examiner

FIG. 7b

REAL TIME TRANSMISSION POWER CONTROL

BACKGROUND

The present invention relates to power control of transmitter equipment in a communication system, and more particularly relates to accurately controlling changes in transmission power levels.

Figure 1:
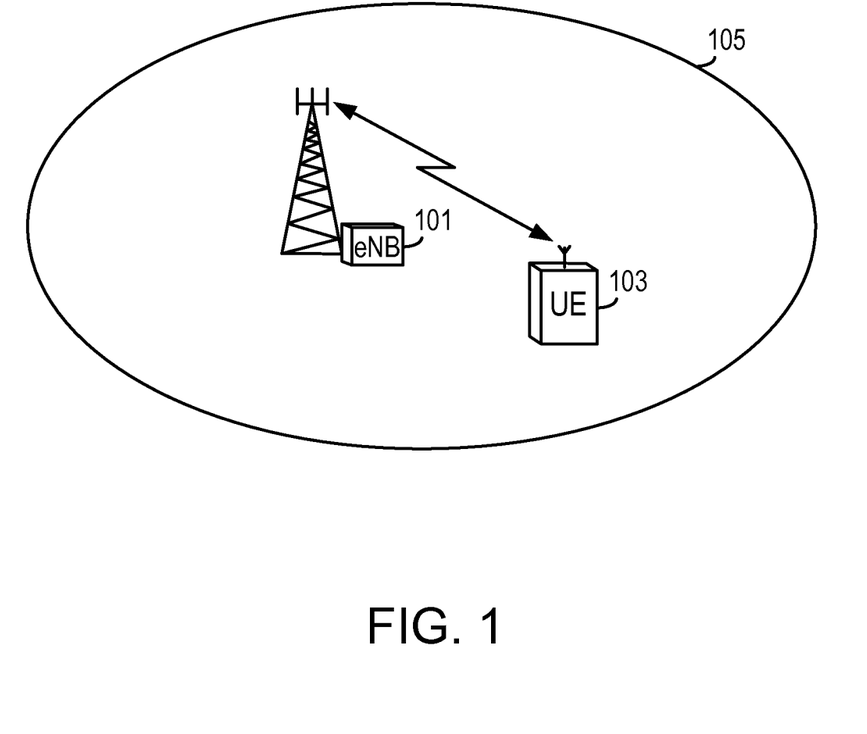
FIG. 1 is a block diagram illustrating a user equipment and a serving node of a typical mobile communication system.

Cellular communication systems are well-known and are in wide-spread use around the world. FIG. 1 is a diagram illustrating a common feature found in most systems: a serving node 101 (depending on the system, it can be called a "base station", a Node B, an evolved Node B ("eNodeB" or "eNB")) serves user equipment (UE) 103 (e.g., a mobile terminal) that is located within the serving node's geographical area of service, called a "cell" 105. For convenience, the term "serving node" will be used henceforth throughout this document, but any such references are not intended to limit the scope of the invention to any one particular system. Thus, references to "serving node" are intended to also refer to "base stations", "Node B's", "eNodeB's", "eNB's", and also to any equivalent node in a cellular communication system.

Communication is typically bidirectional between the serving node 101 and the UE 103. Communications from the serving node 101 to the UE 103 are referred to as taking place in a "downlink" direction, whereas communications from the UE 103 to the serving node 101 are referred to as taking place in an "uplink" direction.

In cellular communication systems, such as but not limited to the Global System for Mobile communication (GSM), Code Division Multiple Access (CDMA), Time Division-synchronous CDMA (TD-SCDMA), Wideband CDMA (WCDMA) and Long Term Evolution (LTE) systems, it is required to adapt the output power level of a transmitted signal based on the signal strength at the antenna port of the transmitter which, for example, can constitute part of UE or mobile station (MS) or serving node. Depending on which transmitter it is whose power is to be controlled (i.e., the serving station's transmitter or the UE's transmitter), dedicated commands for controlling transmitter power are deployed from the MS/UE or from the serving node of the different cellular communication systems.

In cellular communication applications, the accuracy of the absolute transmit power level is sometimes less important than the accuracy of a relative level change of the transmission power. An example of this can be found in the Third Generation Partnership Project (3GPP) WCDMA standard for mobile user equipment. It will be understood that references made herein to the 3GPP WCDMA standard are made for purposes of illustration only, and are not intended to express or imply that the various concepts and principles discussed herein are limited to systems that operate in accordance with that standard. To the contrary, the various inventive aspects described below are usable in other systems as well.

Figure 2:
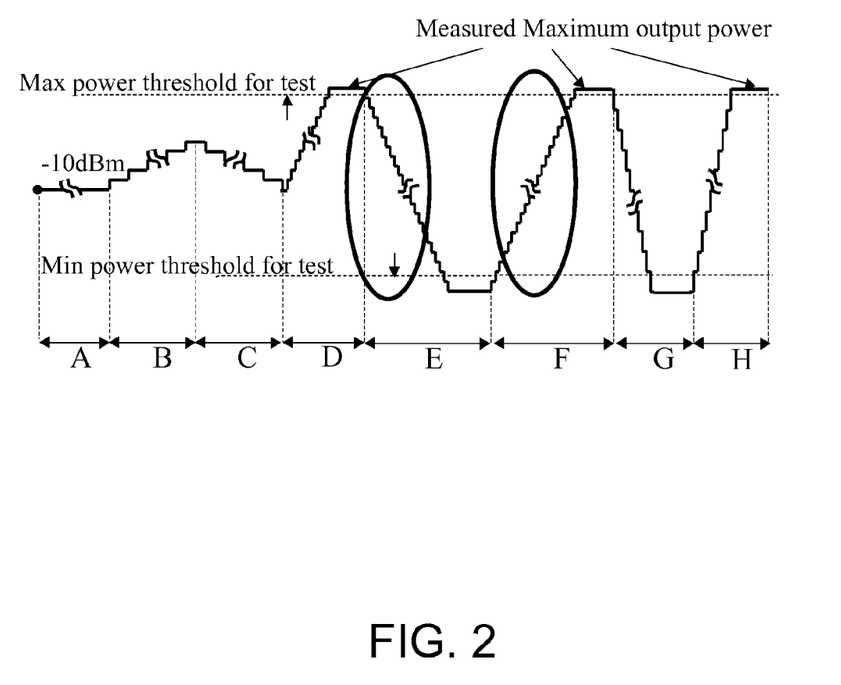
FIG. 2 is a graph of power level test patterns defined by the 3GPP specification.

Transmission power level test patterns defined by the 3GPP specification are depicted in FIG. 2. Different test intervals A, B, C, D, E, F, G, H are shown. In that system, the relative step accuracy between power levels is an extremely tight requirement, especially during test intervals E and F, which call for descending 1 dB steps (test interval E) followed by ascending 1 dB steps (test interval F). For each 1 dB ascending or descending step in power, the relative accuracy is required to be +/−0.5 dB. Across conditions, transmitter path gain adjustments, and the entire 74 dB dynamic range, this can be extremely challenging without time-consuming factory calibration.

Component spreads as well as performance variations due to temperature and supply fluctuations as various applications are run require a dedicated gain calibration for nearly each gain (or power) step to meet the 3GPP specification requirements. This is especially so for those points in the dynamic range where large gain reconfigurations are made to optimize current consumption across output power. Often the error originates from imperfections in the analog paths of a UE or serving node transmitter.

Two different architectures are commonly deployed in mobile cellular communication systems to cope with this problem:

Software (SW) supported feed-forward methods (Open-loop)

Hardware (HW) based correction loops (Closed-loop)

The inventors of the present invention have recognized that these commonly used approaches each have disadvantages, as will now be discussed.

Looking first at SW supported feed-forward (Open-loop) methods, these require a relatively high calibration effort to characterize a particular UE and establish a custom correction table for that unit's gain across output power. This form of unique part-to-part product calibration can become expensive. The achieved accuracy is moderate, and performance margins degrade when the deployed components are temperature sensitive, even to the point of failure depending on the amount of calibration performed. As the number of power steps for which compensation is required increases, memory size and calibration time increase significantly, and depending on the drift and temperature stability/predictability of the components, parts can fail to satisfy specification requirements. Most 3G WCDMA solutions in the market presently, however, take advantage of a more limited conformance requirement to the specification, employ this technique and pay the burden of higher calibration costs in order to benefit from a less complex hardware solution without any feedback path, and manage to save on hardware components for detection and implementation of the loop.

In contrast to the SW supported feed-forward (Open-loop) methods, the HW supported correction techniques (Closed-loop) require additional components to capture/detect an appropriate representation of the transmitted signal and then process it for adjustment to the transmitter path gain. As a result of the additional signal manipulation, the required total component count can increase (depending on implementation). Despite this drawback, the achievable system performance can improve significantly due to the error compensation. The comparison of target absolute and/or relative signal levels to real measured signal levels results in an error signal that, through compensation, can be reduced almost to zero. Unfortunately, drift, imperfections due to component spread, load variations and supply voltage dependencies in the feedback path can degrade the overall accuracy of HW supported correction loops. Partial compensation for these imperfections can be achieved via smart calibration techniques in production, but the afore-mentioned goal of Closed-loop approaches is, of course, to minimize calibration as much as possible, and the implementation needs to be as robust as possible in this regard.

It is a common limitation of all HW correction loops that the available detector technologies have a smaller dynamic range than is required to operate over the entire dynamic range specified by the 3GPP WCDMA standard, and so all HW correction loops need to operate as SW supported (Open-loop) methods at lower powers. Differences in detector technology and associated detector dynamic range result in different systems having different ranges of closed-loop operation, but all of them, at some point, fall-back to Open-loop operation at lower powers. The importance of the Closed-loop correction is typically in the higher and mid power ranges to address the limitation of maximum power across conditions, maximum power compression of the transmitter path/power amplifier, gain expansion of the power amplifier in the mid-power range, and any large gain reconfigurations to optimize direct current (DC) consumption of the power amplifier around mid-power levels.

Conventional HW supported correction loops come in several forms and have different advantages and disadvantages. One form utilizes a purely analog feedback path; another involves some digital processing. The purely analog feedback loop is most-often based on coupling off a representation of the transmitted signal, detecting it as an absolute output power level, comparing the detected absolute power level to the desired absolute power level (of the complex baseband signal, for example), and making corrections to increase or decrease the output power using analog adjustment of a real-time dynamic closed-loop until the difference between the wanted and detected absolute power levels is minimized. This analog loop can pose challenges with respect to stability; time delay adjustment; coupling losses; detector nonlinearity; and absolute power accuracy as a function of frequency, environmental conditions, detector errors, and load mismatch at the output of the transmitter path. A disadvantage of this approach is that if the power is reduced by conditions that make it impossible to reach the absolute power target (for example, as a result of large output load mismatch on the power amplifier), this loop will overdrive into heavy compression and unintentionally destroy the transmitter's signal linearity. Another disadvantage is that the instantaneous envelope distortion in the feedback signal due to limited detector dynamic range can result in large errors. Consequently, the detector dynamic range is typically forced to be larger. The detector accuracy and linearity are also required to be excellent in order to correctly compare to the target reference (i.e., "wanted") power level, and these factors all result in more expensive and power hungry detector technologies.

A second method, which also relies on the measurement and correction of "absolute" power levels, is one in which the transmitted signal's output power is coupled off, averaged heavily and filtered to reduce changes in envelope magnitude to arrive at an average root mean square (RMS) power. The power of the resultant signal is then detected and processed by digital techniques and compared to an expected ("wanted" or "target") average output power (for example, from the complex baseband signal).

The filtering is required because often the peak-to-average power ratio (PAR) of the radiofrequency (RF) signal may vary significantly as a function of time depending on the deployed standards, the chosen coding rates and the selected modulation schemes. For instance, to achieve an RMS signal gain/power accuracy of better than 0.1 dB usually requires up to 50 μs of averaging (measurement) time. A timing delay of, for instance, 50 μs between measurement start and completion of the error correction procedure corresponds commonly to approximately 10% of the total available slot time for TD-SCDMA and WCDMA systems. Unfortunately, the later the correction is performed outside the brief +/−25 μsec window of the inter-slot intended for gain adjustment, the larger the residual error with respect to the wanted RMS burst power and the higher the impact to error vector magnitude (EVM) and adjacent channel leakage ratio (ACLR) will be. In addition, this technique is usually based heavily on software algorithms that further burden the delay of the correction, as opposed to faster methods. This technique still suffers (although less than the purely analog approach discussed above) from the averaged distortion due to detector limited dynamic range, and typically requires high-performance, expensive and power-hungry detector technologies. This technique does, however, benefit from the use of digital techniques to intelligently manage the amount of correction employed under any given condition.

The inventors have recognized that both of the above-mentioned Closed-loop approaches suffer from a large disadvantage in the presence of impedance variations at the antenna. The coupling and detection of the "absolute" transmitter output power relies heavily on isolation from any reflected power coming back from the antenna as a result of impedance mismatch. This reflected power has a significant effect by "leaking" into the desired detector path and corrupting the measurement of the absolute forward power, requiring extremely high directivity couplers, and often the addition of isolators in the transmitter path to further address this problem. These high-performance additional components add significant cost and size to each independent 3G band of the overall solution.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

Moreover, reference letters are provided in some instances (e.g., in the claims and summary) to facilitate identification of various steps and/or elements. However, the use of reference letters is not intended to impute or suggest that the so-referenced steps and/or elements are to be performed or operated in any particular order.

In accordance with one aspect of the present invention, at least some of the foregoing and other objects are achieved in methods and apparatuses for controlling output power of a radio transmitter. Such control comprises, while operating the radio transmitter at an initial power level setting, making a first output power measurement of a radiofrequency signal generated from a source baseband signal. The first output power measurement is adjusted by an incremental value, and the adjusted output power measurement is compared with a first measured power level of the source baseband signal to obtain a theoretical target gain measurement. A power level setting of the radio transmitter is then changed. While operating the radio transmitter at the adjusted power level setting, a second output power measurement of the radio frequency signal generated from the source baseband signal is made. The second output power measurement is compared with a second measured power level of the source baseband signal to obtain an actual gain measurement. A difference value representing a difference between the theoretical target gain measurement and the actual gain measurement is ascertained. The ascertained difference value is used to determine a further power adjustment of the radio transmitter that will reduce the difference between the theoretical target gain measurement and the actual gain measurement.

In some embodiments, controlling the output power of a radio transmitter comprises:

a) operating the radio transmitter at an initial output power level;

b) at a point in the radio transmitter downstream of a radio transmitter power amplifier, detecting a transmitted signal envelope of a radiofrequency signal occurring at a first time interval;

c) adjusting the detected transmitted signal envelope by an incremental amount;

d) ascertaining a first comparison value representing a power level comparison between the adjusted detected transmitted signal envelope and a source baseband signal envelope of a source baseband signal that corresponds to the signal occurring at the first time interval;

e) operating the radio transmitter at an adjusted output power level;

f) at a point in the radio transmitter downstream of the radio transmitter power amplifier, detecting a transmitted signal envelope of a radiofrequency signal occurring at a second time interval;

g) ascertaining a second comparison value representing a power level comparison between the detected transmitted signal envelope of the radiofrequency signal occurring at the second time interval and a source baseband signal envelope of a source baseband signal that corresponds to the radiofrequency signal occurring at the second time interval; and h) if the first comparison value and the second comparison value do not satisfy a predefined relationship with respect to one another, then predicting a further adjusted power level that will increase a likelihood that the first comparison value and the second comparison value will satisfy the predefined relationship with respect to one another, and operating the radio transmitter at the further adjusted output power level.

In some embodiments, the control methodology comprises ascertaining whether the adjusted detected signal power lies within a predefined range of values and performing steps d) through h) only if it is ascertained that the adjusted detected signal power lies within the predefined range of values.

In an aspect of some embodiments, steps c) through g) are performed in the digital domain.

In an aspect of some embodiments, operating the radio transmitter at the further adjusted output power level comprises changing one or more gain control signals that control one or more of a gain of a modulator that is part of the radio transmitter, a gain of the power amplifier of the radio transmitter, and a gain level of a digital baseband signal to be transmitted by the radio transmitter.

In an aspect of some embodiments, the first time interval occurs prior to the second time interval. In alternative embodiments, the reverse is true.

In an aspect of some embodiments, ascertaining the first comparison value comprises averaging a plurality of comparison results.

In an aspect of some embodiments, ascertaining the first comparison value comprises ensuring that an attribute associated with the adjusted detected transmitted signal envelope matches an attribute of the source baseband signal prior to comparing the adjusted detected transmitted signal envelope with the source baseband signal.

In an aspect of some embodiments, ascertaining the first comparison value comprises, prior to comparing the adjusted detected transmitted signal envelope with the source baseband signal, delaying the baseband signal by an amount that ensures that the adjusted detected transmitted signal envelope corresponds to the source baseband signal.

BRIEF DESCRIPTION OF THE DRAWINGS

The objects and advantages of the invention will be understood by reading the following detailed description in conjunction with the drawings in which.

DETAILED DESCRIPTION

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system or other hardware capable of executing programmed instructions. It will be recognized that in each of the embodiments, the various actions could be performed by specialized circuits (e.g., analog and/or discrete logic gates interconnected to perform a specialized function), by one or more processors programmed with a suitable set of instructions, or by a combination of both. The term "circuitry configured to" perform one or more described actions is used herein to refer to any such embodiment (i.e., one or more specialized circuits and/or one or more programmed processors). Moreover, the invention can additionally be considered to be embodied entirely within any form of computer readable carrier, such as solid-state memory, magnetic disk, or optical disk containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments as described above may be referred to herein as "logic configured to" perform a described action, or alternatively as "logic that" performs a described action.

The inventors have observed that the 3GPP specification for the WCDMA/LTE standard is very specific about the requirement for "gain step accuracy" and not as concerned about the accuracy of the absolute power level. In order for the network to overcome the "Near-Far" problem and adjust all the UEs in each cell for minimum cross-interference, each UE has to dynamically adjust its output power relative to all the other UEs in that cell. This constant adjustment to each UEs output power is done relative to its own output power in the previous time slot, and it is that incremental, "relative", gain step (or Differential Nonlinearity [DNL]) that is most critical to control and adjust to meet the specification.

Figure 3:
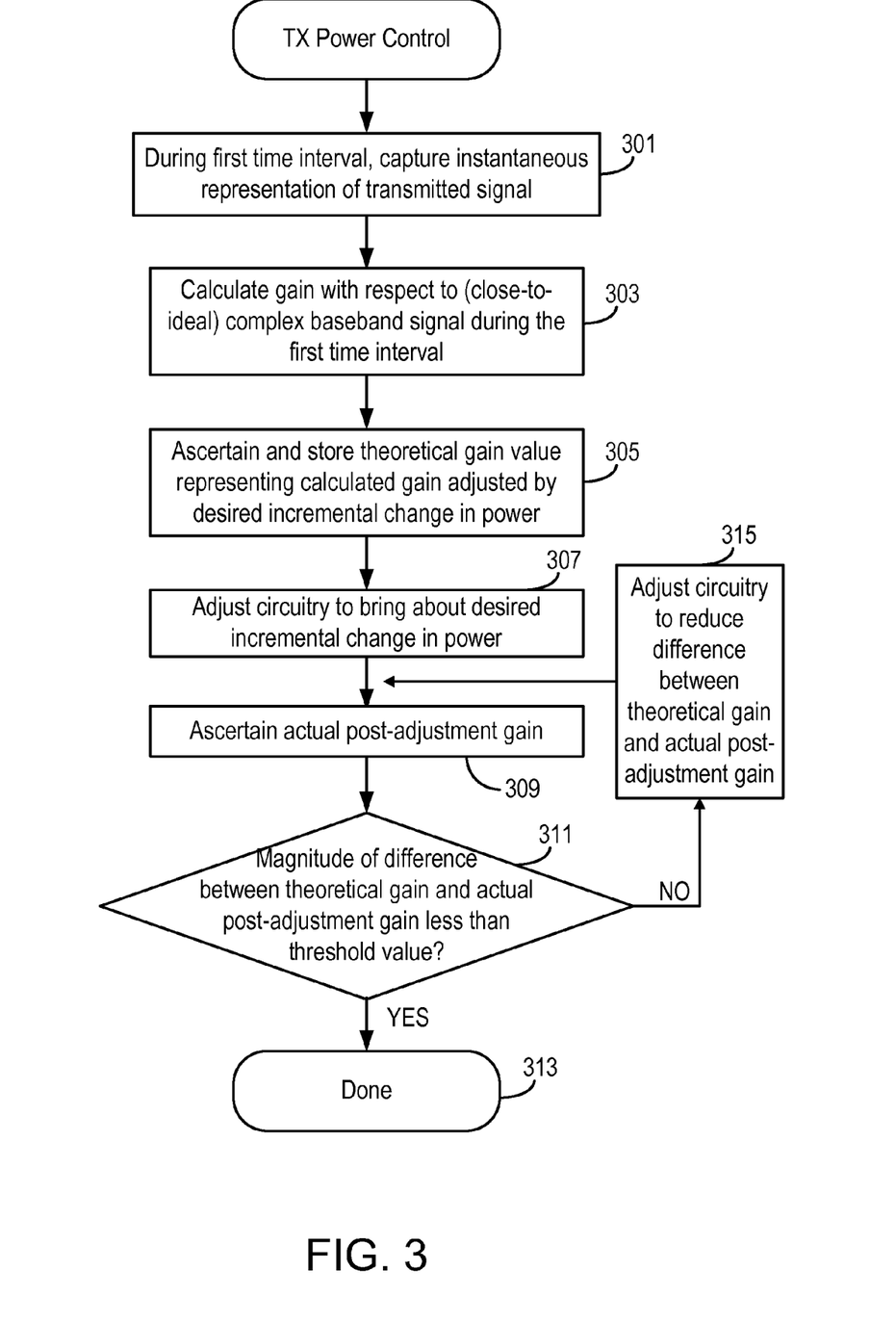
FIG. 3 is, in one respect, a flow diagram of steps/processes performed in accordance with some embodiments of the invention.

Unlike conventional techniques, various aspects of embodiments consistent with the invention utilize relative rather than absolute measurements of power to achieve accurate control of transmitter power changes. FIG. 3 is, in one respect, a flow diagram of steps/processes performed in accordance with embodiments of the invention. In another respect, FIG. 3 can be considered to depict various circuitry configured to perform the described functions.

The transmit power control mechanism is based on the detection and capture of an instantaneous representation of the transmit signal during a first time interval (e.g., time slot) while the radio transmitter is operating at an initial power level (step 301). The gain of the transmitter is calculated with respect to the (close-to-ideal) complex baseband signal during that same first portion of time (step 303). This gain is then adjusted mathematically to ascertain a theoretical gain value representing the calculated gain adjusted by a desired incremental change in transmit power (e.g., a 1 dB incremental change) (step 305). That is, the output power of the transmitter is not yet changed. The ascertained theoretical gain value is stored for later use.

Next, the gain change is actually made (intended to be the desired incremental change in transmit power, e.g., 1 dB) (step 307). During a second, for example subsequent, time interval (e.g., time slot) the instantaneous representation of the transmit signal is detected, and the coupled/detected power is once again divided by the complex signal amplitude over the same second time interval to ascertain an actual post-adjustment gain measurement (step 309). The actual post-adjustment gain measurement value is then digitally compared to the theoretical gain ascertained from the first time period (decision block 311). If these match to within an acceptable tolerance (e.g., if the magnitude of difference between the theoretical gain and the actual post-adjustment gain is less than a predetermined threshold value) ("YES" path out of decision block 311), then no further adjustment is required ("DONE", step 313).

However, if the measured actual post-adjustment gain step either falls short or exceeds the desired incremental change in transmit power ("NO" path out of decision block 311), then subsequent coarse and/or fine adjustment may be made as needed (step 315), and new measurements are made and compared (steps 309, 311) until acceptable accuracy for the gain step is reached ("YES" path out of decision block 311).

Particular details implementation details can vary from one embodiment to another. For example, when comparing the measured actual post-adjustment gain step with the desired incremental change in transmit power, some embodiments can utilize magnitude values, for example where it is known that initial adjustments will always be too high or too low (e.g., if the initial adjustment is known to always be too low, then the magnitude value informs by how much the adjustment will have to be increased in the next iteration). By contrast, in other embodiments, the sign of the difference between the measured actual post-adjustment gain step and the desired incremental change in transmit power is needed because it informs whether the initial (preceding) adjustment was too high or too low. The adjustment in the next iteration can therefore be calculated to counteract this adjustment error.

It is noted that having made the desired incremental change in transmit power to an acceptable level of accuracy, it is also possible to calculate the actual transmit power level, if such a measurement is needed. The actual (i.e., absolute as opposed to relative) transmit power level can be ascertained from the known power applied to the reference path plus the total feedback path gain (attenuation) plus the remaining error (to be corrected).

An advantage to this approach (besides specifically addressing the requirement for "Relative" gain step accuracy), is that errors that typically destroy "Absolute" power accuracy are substantially eliminated as long as those errors do not change appreciably over the length of time required for the gain step. This includes variation in transmitter path gain due to temperature, battery voltage, output antenna impedance, coupler and power amplifier matching frequency dependence, and the like. All of these effects occur quite slowly, and affect the first time interval exactly the same as the second time interval after the gain step, so the accuracy of the increment is preserved.

This is true of antenna impedance changes as well, such that reflected power can be arbitrarily large and combine with forward power at the detector. The net desired incremental change in forward power (e.g., 1 dB) will still produce the same incremental change at the detector between the time slot before and after the gain step, regardless of the voltage standing wave ratio (VSWR) environment and amount of reflected power. This factor eliminates any requirement for isolation, and enables the proposed method to eliminate expensive couplers (replaced with simple, low cost capacitive/resistive dividers to sniff the TX signal without any directivity or isolation), and to eliminate the isolators as well. The detector accuracy is also significantly relaxed, as it no longer is required to maintain "absolute" accuracy, but only the "relative" accuracy across the worst case gain step. This detector nonlinearity requirement is much easier to meet, and enables much less expensive AM/diode envelope detector technologies, which also consume less DC power. DC offset and temperature drift become much less critical for the detector under the proposed transmitter power control mechanism, as well as for the analog-to-digital converter (ADC) following the detector. These are strong advantages overall for bill-of-materials (BOM), cost, and area compared with conventional approaches.

Figure 4:
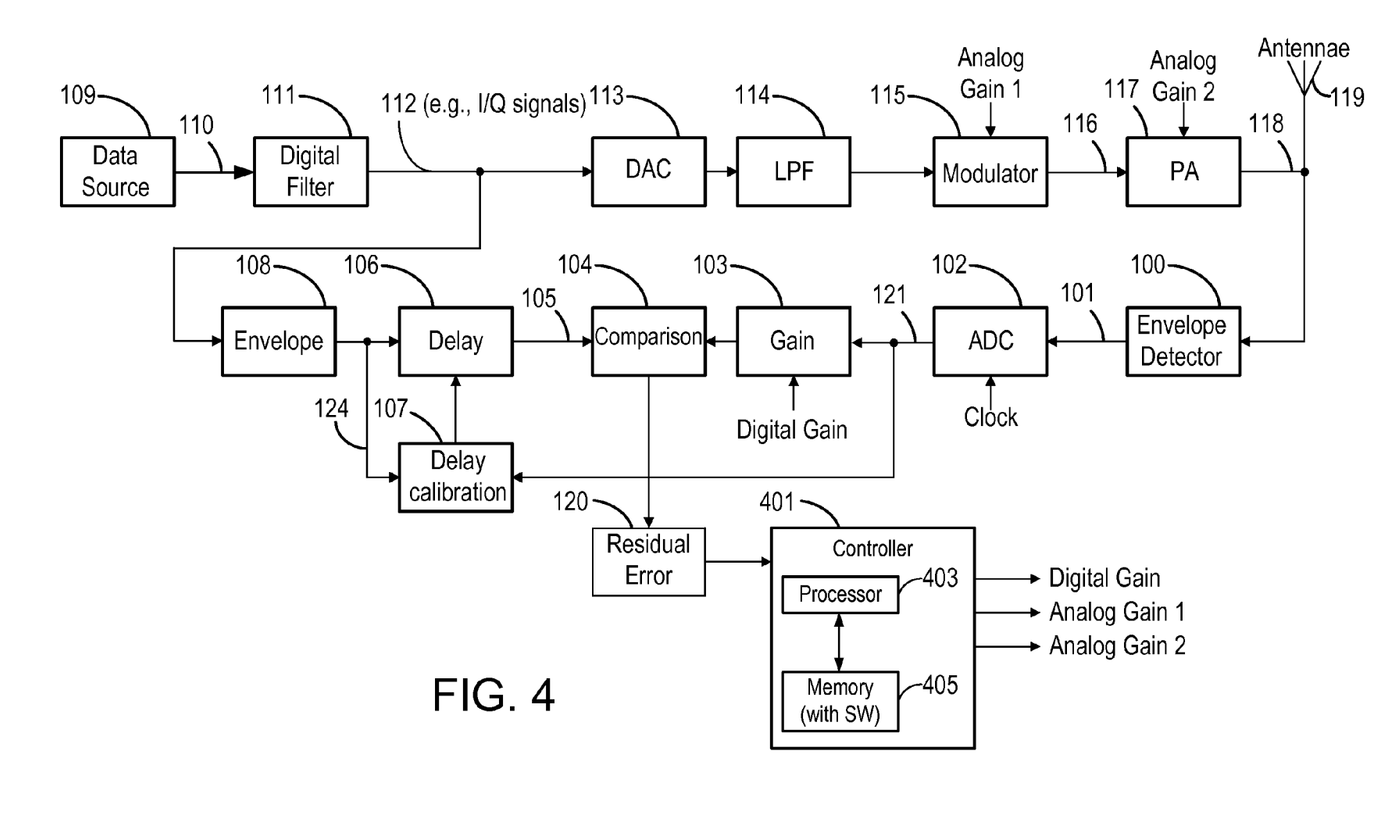
FIG. 4 is a block diagram of an embodiment of a radio transmitter architecture that incorporates one or more aspects of the invention.

An embodiment of a transmit path architecture of a dedicated radio transmitter for cellular communication that incorporates aspects of the invention is depicted in FIG. 4. A Closed-loop architecture is utilized, wherein the loop can be closed by means of software, hardware, or a combination of both. In this embodiment, the Closed-loop architecture ascertains a Residual Error 120, which represents the difference between a wanted (target) and actual transmitter path gain (power). The Residual Error 120 is utilized to correct the gain of the modulator 115 or power amplifier 117 by means of one or more control signals, identified herein as Analog Gain1 and Analog Gain2 respectively.

Looking at the architecture in more detail, the depicted arrangement comprises a generic transmitter forward path as well as additional blocks configured to carry out one or more aspects of the invention. In the generic transmitter forward path, a data source 109 generates an appropriately pre-processed digital data sequence 110 required for a generic digital communication system, and supplies this to a digital filter 111. The digital filter 111 realizes the standard specific digital data sequence filtering, and may therefore vary from one embodiment to another. The filtered digital sequence 112 (e.g., I/Q signals) supplied by the digital filter 111 are converted into a corresponding analog signal by a digital-to-analog converter (DAC) 113. The analog signal is supplied to a low pass filter (LPF) 114 that, in typical embodiments, rejects quantization noise originated by the digital to analog conversion. The filtered analog signal (baseband signal) is supplied to a modulator 115 that mixes the filtered analog signal with an RF carrier signal (not shown) to generate a modulated RF signal 116. The RF power gain of the modulator 115 is adjustable based on a control signal herein referred to as "Analog Gain 1". The modulated RF signal 116 is supplied to a power amplifier (PA) 117 that amplifies the modulated RF signal 116 to a desired RF signal power. The amplified RF signal 118 is radiated by an antenna 119. The PA gain can be varied by a control signal herein referred to as Analog Gain 2. By appropriately varying the Analog Gain 2 signal, it is possible to achieve, for example, RF power ramping, RF power leveling or target transmitter path efficiency levels. In this exemplary embodiment, the data source 109, digital filter 111, and DAC 113 operate in the digital domain, whereas the LPF 114, modulator 115, power amplifier 117 and antenna 119 operate in the analog domain. The performance of the analog blocks may vary due to environmental changes (e.g. temperature, power supply, VSWR).

In the exemplary embodiment, the generic transmitter path output signal 118 feeds the antenna 119 and a generic transmitter feedback path. The signal 118 is depicted as being tapped right at the input to the antenna 119, but more generally can be considered to be a signal detected at any point in the transmitter that is downstream of the power amplifier 117. As used herein, the term "downstream" means at a point in the circuit that can trace its source back to an output of a circuit. Similarly, to be "upstream" of a given circuit means to be at a point in an overall circuit that either or through other circuits feeds an input of the given circuit.

The exemplary embodiment further includes circuitry for generating one or more control signals (e.g., Digital Gain, Analog Gain 1, Analog Gain 2) for controlling the gain of the transmitter. In the exemplary embodiment, this circuitry includes a generic transmitter feedback path comprising an envelope detector 100 that operates in the analog domain. The envelope detector 100 receives the RF signal 118, and operates to remove any RF portion of the signal. This leaves an analog transmitted envelope signal 101 (detected transmitted baseband signal) that is converted into a corresponding digital signal by an analog-to-digital converter (ADC) 102. The digital representation of the transmitted envelope signal is supplied to gain circuitry 103 that, by digital means, is able to adjust (i.e., increase or decrease), the amplitude of the digital representation of the transmitted envelope signal. The amount of gain that the gain circuitry 103 applies is controlled by a digital gain control signal. More about how this is used is described below. The gain adjusted digital representation of the transmitted envelope signal is then supplied to comparison circuitry 104.

The signal with which the gain adjusted digital representation of the transmitted envelope signal is compared is generated by the following circuitry: At some point in the transmit path downstream of the modulator 115 (and hence also the power amplifier 117), the analog baseband signal to be transmitted is supplied to envelope detection circuitry 108. In the exemplary embodiment, the filtered digital sequence 112 is used for this purpose. Since, in the exemplary embodiment, the digital sequence 112 is represented by pairs of I and Q samples, the envelope detection circuitry 108 uses these to generate a corresponding power envelope signal. It will be appreciated that in alternative embodiments in which the digital baseband signal is represented by only a single stream of digital samples rather than pairs of samples, the envelope detection circuitry 108 might not be needed.

It is desired to compare the power envelope signal of the original baseband signal with the gain adjusted digital representation of the transmitted envelope signal. However, for the comparison to be meaningful, the two must correspond to one another; that is, the gain adjusted digital representation of the transmitted envelope signal should be compared with the power envelope signal of the original baseband signal from which it was generated. But since the forward path transmitter circuitry imposes some delay between the time that the digital sequence 112 appears and the time that the gain adjusted digital representation of the transmitted envelope signal is generated, it is necessary to delay the power envelope signal of the original baseband signal by an amount that will cause it to be time-aligned with the gain adjusted digital representation of the transmitted envelope signal supplied to the comparison circuitry 104. The delay circuitry 106 adds this delay. The amount of delay is controlled by a signal generated by delay calibration circuitry 107 that receives two inputs: one associated with the power envelope signal of the original baseband signal, and another associated with the digital representation of the transmitted envelope signal. The delay calibration circuitry 107 can operate by comparing some attribute of the two signals and determining how much delay would be necessary to cause each sample from the reference path to be compared with a corresponding sample from the feedback path. The required delay time step resolution of block 106 should be on the order of or less than ⅛ chip (symbol) rate. The delay calibration circuitry 107 can, as a non-limiting example, be implemented as a polarity-coincidence-correlator. Polarity-coincidence-correlators are known to those of ordinary skill in the art, and therefore need not be described herein in detail.

The delayed signal 105 is supplied to a second input port of the comparison circuitry 104. The comparison circuitry compares the delayed signal 105 to the gain adjusted digital representation of the transmitted envelope signal and generates a residual error value 120 as a comparison result. The residual error value 120 could, for example, represent a gain value or other difference between the power envelope signal of the original baseband signal and the gain adjusted digital representation of the transmitted envelope signal. The residual error value is supplied to control circuitry 401 that uses the residual error value to ascertain what control signals to generate to correct the gain (power) imperfections in the generic TX path. In the embodiment of FIG. 4, generated control signals include the Digital Gain, Analog Gain 1, and Analog Gain 2 control signals. The control circuitry 401 can be embodied in any of a number of ways, included hardwired circuitry. In the embodiment illustrated in FIG. 4, the control circuitry 401 includes a programmable processor 403 and a memory 405 that can store data as well as program code for controlling the programmable processor 403.

Figure 5:
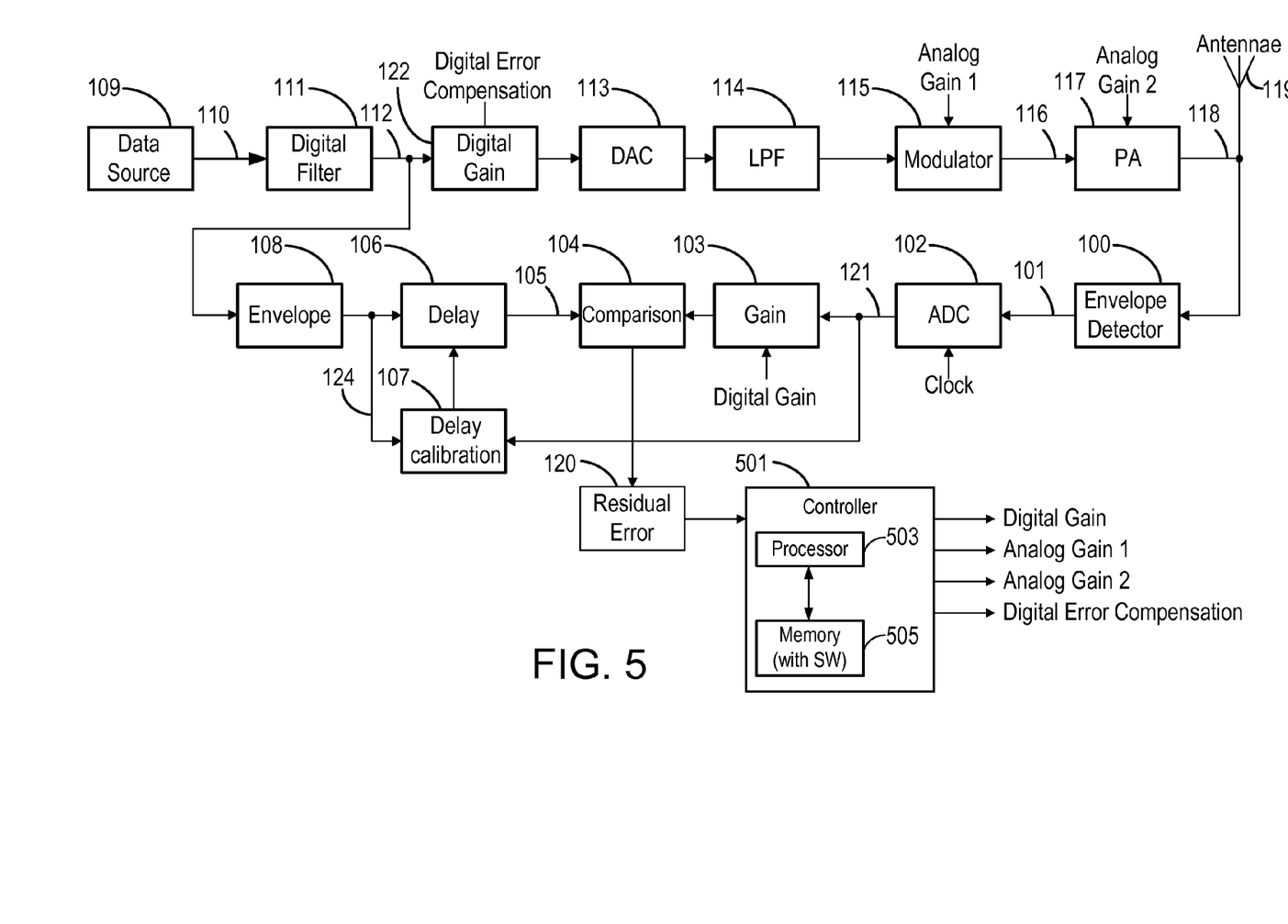
FIG. 5 is a block diagram of an alternative embodiment of a radio transmitter architecture that incorporates one or more aspects of the invention.

FIG. 5 is a block diagram of an alternative embodiment of a transmit path architecture of a dedicated radio transmitter for cellular communication that incorporates aspects of the invention. As with embodiments illustrated by FIG. 4, embodiments illustrated by FIG. 5 utilize a Closed-loop architecture, wherein the loop can be closed by means of software, hardware, or a combination of both. In this embodiment, the Closed-loop architecture ascertains a Residual Error 120, which represents the difference between a wanted (target) and actual transmitter path gain (power). The Residual Error 120 is utilized to correct the gain of the modulator 115, a power amplifier 117, or digital gain circuitry 122 by means of one or more control signals, identified herein as Analog Gain1, Analog Gain2, and Digital Error Compensation respectively. As can be seen by comparing this architecture with that of FIG. 4, the basic transmit path architecture is extend by one digital block (i.e., digital gain circuitry 122) that is incorporated into the generic transmitter path. The digital gain circuitry 122 realizes a fine gain control of the filtered digital data sequence 112 according to the control signal Digital Error Compensation. It is advantageous to utilize a fine gain step that is on the order of 0.2 dB or less. The control signals for this embodiment are generated by control circuitry 501 which can be embodied in any of a number of ways, such as by hardwired circuitry. In the embodiment illustrated in FIG. 5, the control circuitry 501 includes a programmable processor 503 and a memory 505 that can store data as well as program code for controlling the programmable processor 503. Other circuit elements of the architecture of FIG. 5 are the same as those shown in FIG. 4, and therefore need not be described again.

Figure 6:
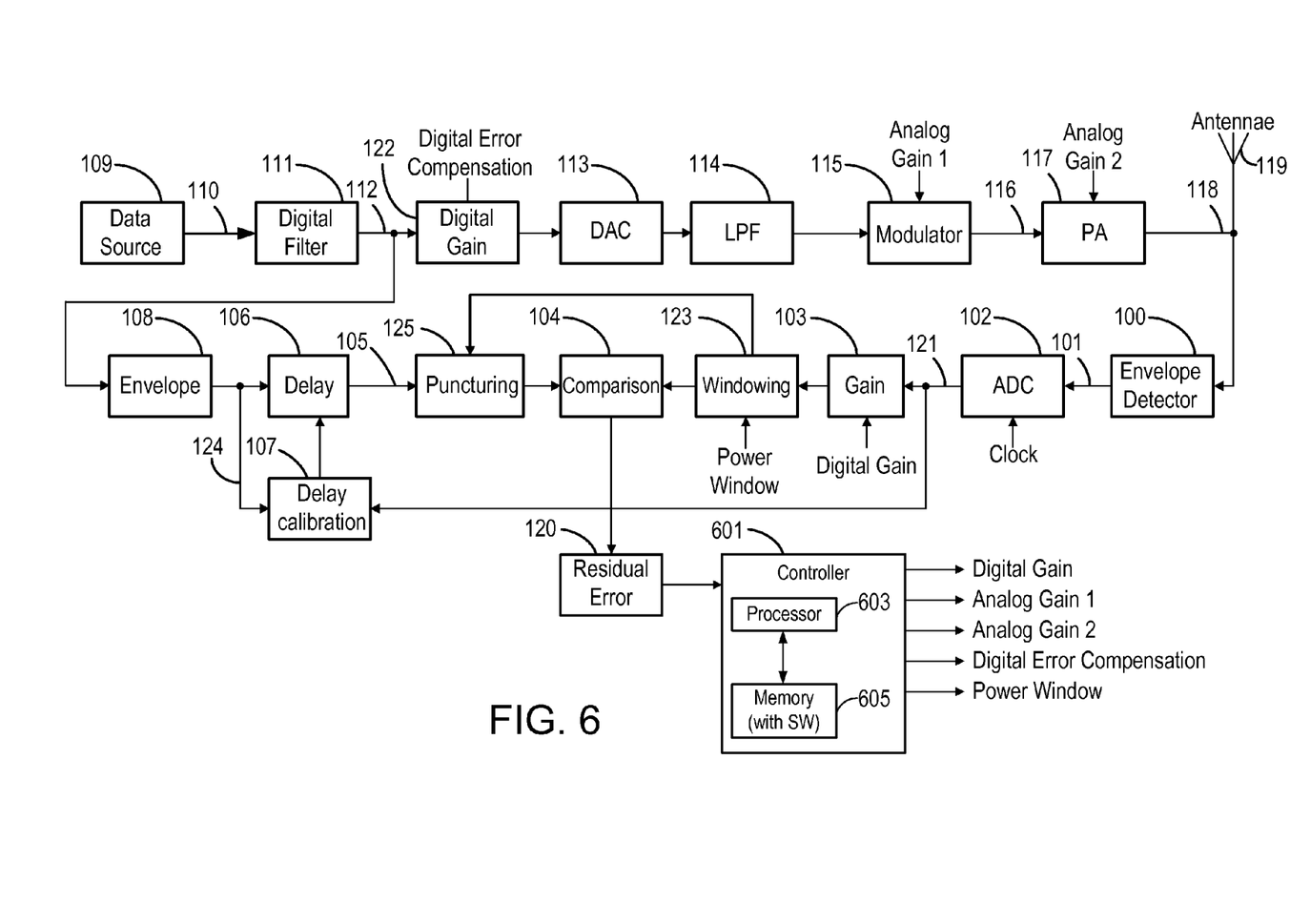
FIG. 6 is a block diagram of yet another alternative embodiment of a radio transmitter architecture that incorporates one or more aspects of the invention.

FIG. 6 is a block diagram of yet another alternative embodiment of a transmit path architecture of a dedicated radio transmitter for cellular communication that incorporates aspects of the invention. As with embodiments illustrated by FIGS. 4 and 5, embodiments illustrated by FIG. 6 utilize a Closed-loop architecture, wherein the loop can be closed by means of software, hardware, or a combination of both. In this embodiment, the architecture is further extended by the addition of windowing circuitry 123 and puncturing circuitry 125 in the feedback path. The windowing circuitry performs windowing of the incoming data sequence in accordance with a defined Power Window range (i.e., a power window defined by upper and lower limits). If a received data sample lies within this range, it is passed through to the output of the windowing circuitry 123; otherwise the data sample is discarded.

To account for discarded samples, information from the windowing circuitry 123 is supplied to the puncturing circuitry 125 to indicate which samples (e.g., identified by their associated time stamps) have been discarded. The puncturing circuitry 125 receives digital samples, and accordingly discards those samples that correspond to the ones discarded by the windowing circuitry 123.

In the architecture of FIG. 6, the windowing circuitry 123 receives the gain adjusted digital representation of the transmitted envelope signal and, as described above, passes only those samples that lie within the defined Power Window. The samples passed by the windowing circuitry 123 are passed to one input port of the comparison circuitry 104.

The puncturing circuitry is similarly interposed between the delay circuitry 106 and another input port of the comparison circuitry 104 so that the comparison circuitry 104 will always have corresponding pairs of samples to compare; if a digital sample has been discarded rather than being supplied to one input of the comparison circuitry, its counterpart will be similarly discarded rather than being supplied to the other input of the comparison circuitry 104.

The control circuitry 601 in this embodiment therefore generates control signals that include the Digital Gain, Analog Gain 1, Analog Gain 2, Digital Error Compensation, and Power Window control signals for controlling various circuit elements of this embodiment. The control circuitry 601 can be embodied in any of a number of ways, such as by hardwired circuitry. In the embodiment illustrated in FIG. 6, the control circuitry 601 includes a programmable processor 603 and a memory 605 that can store data as well as program code for controlling the programmable processor 603. Other circuit elements of the architecture of FIG. 6 are the same as those shown in FIGS. 4 and 5, and therefore need not be described again.

Figure 7A:
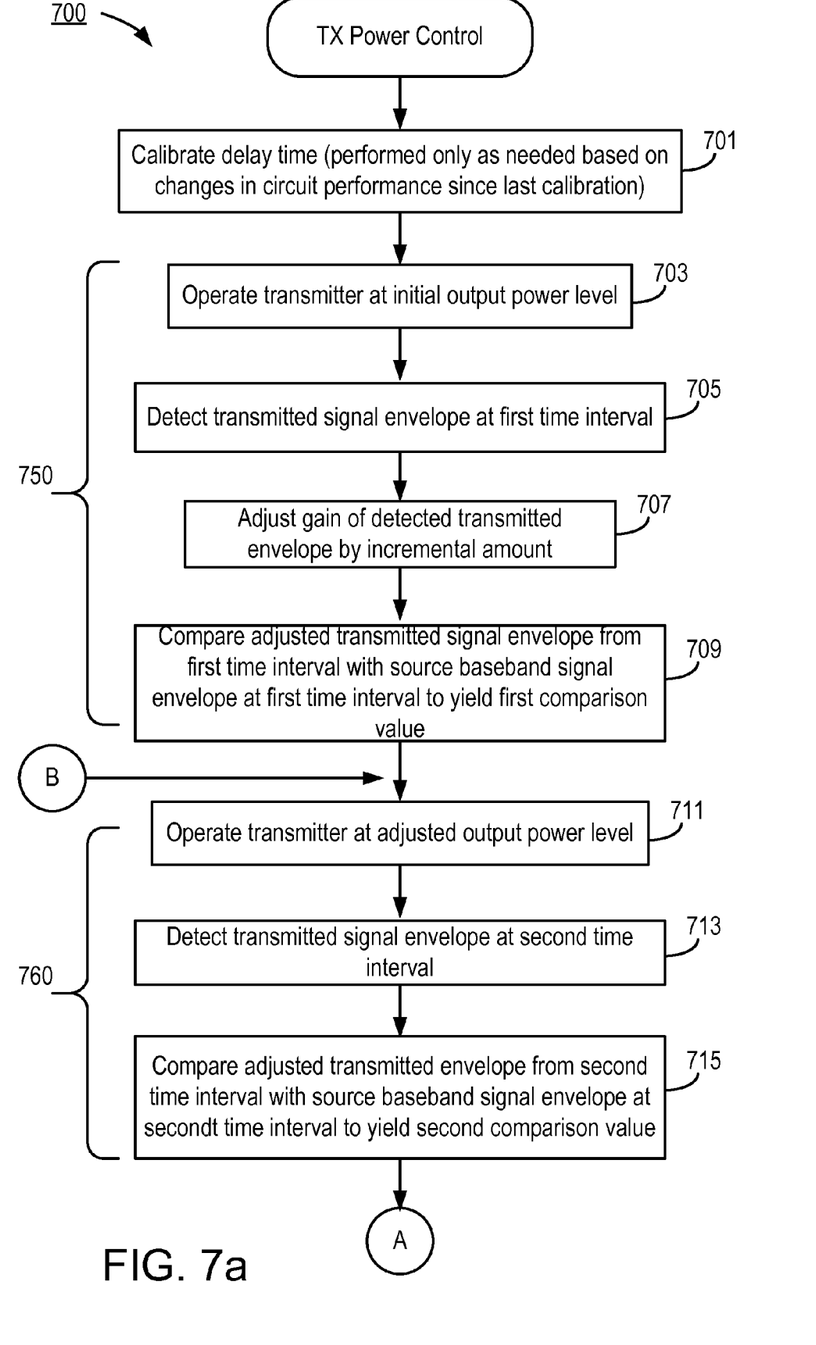
FIGS. 7a and 7b, in one respect, together depict a flow diagram of steps/processes performed in accordance with some embodiments of the invention.
Figure 7B:
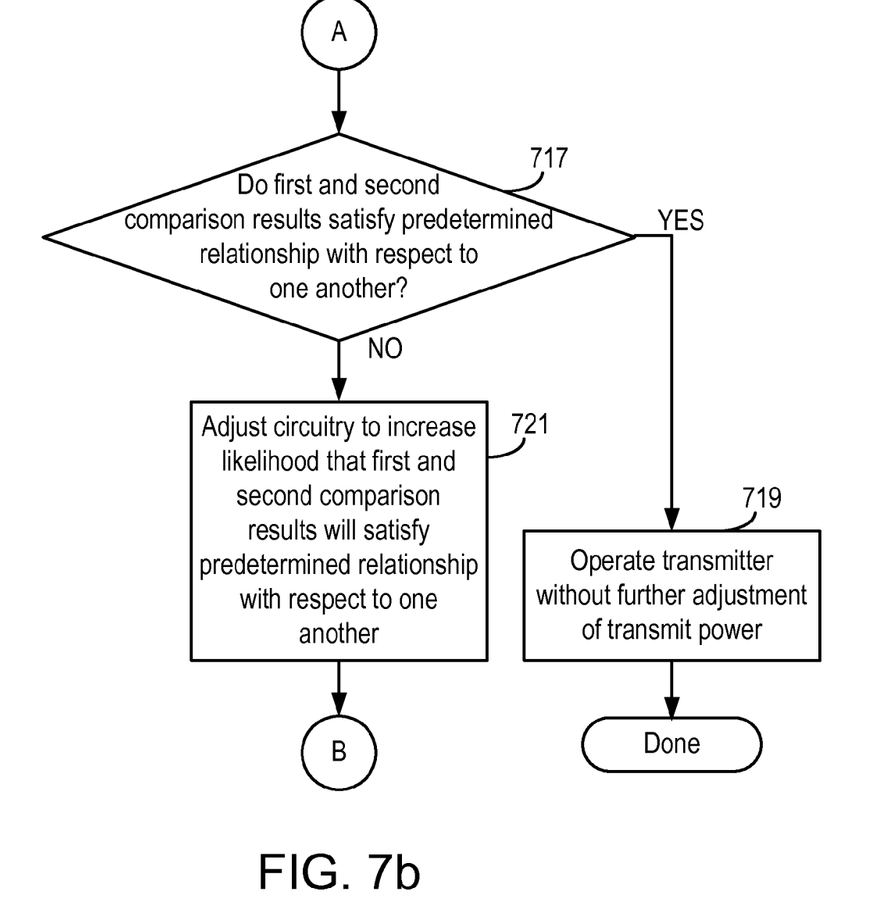

Across all of the illustrated embodiments of FIGS. 4, 5, and 6, the respective controllers 401, 501, and 601 may generate signals in accordance with the principles depicted in FIG. 3. Consistent with these principles, the specific hardware elements depicted in FIG. 6 can be controlled as shown in FIGS. 7a and 7b which, in one respect, together depict a flow diagram of steps/processes performed in accordance with aspects of the invention. In another respect, FIGS. 7a and 7b can together be considered to depict a controller 700 comprising various means for performing the described functions.

The functions described in FIGS. 7a and 7b assume an embodiment consistent with that which is depicted in FIG. 6. When an architecture consistent with FIG. 5 is employed, those functions relating to windowing and puncturing should be omitted. When an architecture consistent with FIG. 4 is employed, those functions relating to windowing, puncturing, and fine gain control should be omitted.

The following hardware and data aspects are assumed: It is desirable to have the capability of correcting potential transmitter path gain step errors almost in real time. Therefore an oversampling factor of the signals 112 and 121 by a factor of eight or higher is recommended.

A digital data sequence 110 (I/Q) with dedicated time-stamped samples is generated by data source 109. The digital data sequence 110 is filtered by the digital filter 111 and is fine gain adjusted by the digital gain circuitry 122. Afterwards, the signal sequence is routed to two paths, one feeding the DAC 113 and the other feeding the envelope circuitry 108. The remaining generic transmitter path (e.g., blocks 113, 114, 115, 117 and 119) converts the signal 112 (after digital gain adjustment) into its analog representative, mixes it up to RF and then adjusts its magnitude for proper power control as described further below.

The envelope detection 108 determines the signal envelope that will be created from the I/Q data sequences 112. A linear or logarithmic processed digital envelope sequence 105 leaves the envelope circuitry 108 and is supplied to the delay circuitry 106, which delays the digital envelope sequence 105 with respect to the signal 121 to ensure that there exists a maximal correlation between the time stamp numbers of the digital envelope sequence 105 and the signal 121. It is further assumed that the puncturing circuitry 125, ADC 102, and gain circuitry 103 are synchronously clocked. It is important for the performance that same time stamp numbers of the original signal 112 and its detected image 121 be compared to each other. Any time offset between these two signals leads to performance degradation of the real time transmitter power correction procedure. The comparison circuitry 104 performs comparisons on a sample-to-sample basis. It is advantageous for the Residual Error value 120 to be computed as an average value of a certain number of samples. In WCDMA applications, the averaging factor should be 128 or greater (8 times oversampling assumed).

With these assumptions in place, real time transmitter power correction can be performed as follows. First, a delay calibration should be performed (step 701). The delay calibration does not have to be each time a measurement is to be performed. Rather, the repetition rate depends on the delay impacts from the low pass filter 114, modulator 115, power amplifier 117, antenna 119, and envelope detector 100. As mentioned above, the polarity coincidence correlation technique can be utilized to determine the correct time stamp value to be set for the delay circuitry 106.

Once the proper delay value has been determined, a first measurement process 750 can be performed. The first measurement process 750 comprises operating the transmitter at an initial power level (step 703) and detecting the transmitted signal envelope at a first time interval (having one or more corresponding time stamp values) (step 705). The gain of the detected transmitted signal envelope is then adjusted by a desired incremental amount (e.g., 1 dB) (step 707). This adjustment is made by the gain circuitry 103. Note that no other adjustments are made to the transmitter circuitry at this time. The comparison circuitry 104 is then operated to generate a first comparison result by comparing the adjusted transmitted signal envelope (corresponding to the first time interval) with the source baseband signal envelope (also corresponding to the first time interval, so that the comparison is meaningful) (step 709). It will be understood that the transmitter circuitry should be operated in this manner for a first time interval that is long enough to enable the collection of a number of test measurements that can be averaged, wherein the average represents the first comparison value.

Next, a second measurement process 760 can be performed. The second measurement process 760 comprises operating the transmitter at an adjusted power level that is intended to achieve the desired incremental amount of power change (step 711). The incremental change in power can be attempted by adjusting either or both of the control signals Analog Gain 1, Analog Gain 2 that control the respective gains of the modulator circuitry 115 and power amplifier 117. The operation of all other circuit elements remains unchanged. The transmitted signal envelope is then detected during a second time interval (having one or more corresponding time stamp values) (step 713). The comparison circuitry 104 is then operated to generate a second comparison result by comparing the detected transmitted signal envelope (corresponding to the second time interval) with the source baseband signal envelope (also corresponding to the second time interval, so that the comparison is meaningful) (step 715). It will be understood that the transmitter circuitry should be operated in this manner for a second time interval that is long enough to enable the collection of a number of test measurements that can be averaged, wherein the average represents the second comparison value. It will also be understood that in order for the comparison circuitry 104 to be able to perform the specified comparison involving the detected transmitted signal envelope, the gain circuitry 103 must be set back to the value it had prior to performance of the first measurement process 750; that is, the applied Digital Gain that had been applied to the gain circuitry 103 during the first measurement process must be reset during the second measurement process.

Here it will be observed that the first measurement process 750 is illustrated and described as occurring prior to the second measurement process 760. However, in alternative embodiments, this need not be the case. Therefore, as used herein, the terms "first time interval" and "second time interval" do not indicate which time interval is earlier or later than the other; rather, these terms merely distinguish one time interval from another without requiring, for example, that the second time interval occur subsequent to the first time interval (although that is also a permissible embodiment).

Following performance of the first and second measurement processes 750, 760, the first and second comparison results are analyzed to ascertain whether they satisfy a predetermined relationship with respect to one another (decision block 717). For example, it can be ascertained whether the magnitude of the difference between the first and second comparison results (which represents the error in power adjustment) is less than a predefined threshold, meaning that the adjustment applied to the transmitter circuitry during the second measurement process 760 was accurate enough to achieve the desired incremental change in transmit power.

If the first and second comparison results satisfy the predetermined relationship with respect to one another ("Yes" path out of decision block 717), the transmitter can be operated without the need for any further adjustments (step 719).

However, if the first and second comparison results do not satisfy the predetermined relationship with respect to one another ("No" path out of decision block 717) further adjustments of the transmitter power are made. The nature of these adjustments can be determined based on whether the present operation is at too high a power level or too low a power level, and possibly also on by how much the first and second comparison results differ. Changes in transmitter output power can be made by adjusting the power level of any one or more of the digital gain circuitry 122, modulator circuitry 115, and power amplifier 117. An advantage of utilizing the Digital Error Correction signal is that, in the digital domain, very fine gain steps can be realized (e.g., <<0.5 dB/step); comparable gain steps are difficult to achieve by means of analog circuitry.

After making an additional adjustment as specified in step 721, the process is preferably repeated starting at block 711 to iterate the process until the first and second comparison results satisfy the predetermined relationship with respect to one another.

It can be seen that, in the various above-described embodiments, the proper transmitter adjustment is made iteratively by comparing actual results with the theoretical target gain measurement. It is possible to create embodiments in which the first adjustment of the power level setting of the radio transmitter is made "blindly" (e.g., completely oblivious of the desired target power setting), and the strategy employed in the various embodiments should still eventually arrive at the proper setting (although this will no doubt be inefficient and thereby take longer). It is therefore desirable, but not essential to the invention, to try to achieve the desired incremental change in transmit power during the first iteration.

The invention has been described with reference to particular embodiments. However, it will be readily apparent to those skilled in the art that it is possible to embody the invention in specific forms other than those of the embodiment described above. The described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of controlling output power of a radio transmitter, the method comprising:
    while operating the radio transmitter at an initial power level setting, making a first output power measurement of a radiofrequency signal generated from a source baseband signal;
    adjusting the first output power measurement by an incremental value;
    comparing the adjusted output power measurement with a first measured power level of the source baseband signal to obtain a theoretical target gain measurement;
    adjusting a power level setting of the radio transmitter;
    while operating the radio transmitter at the adjusted power level setting, making a second output power measurement of the radio frequency signal generated from the source baseband signal;
    comparing the second output power measurement with a second measured power level of the source baseband signal to obtain an actual gain measurement;
    ascertaining a difference value representing a difference between the theoretical target gain measurement and the actual gain measurement; and
    using the ascertained difference value to determine a further power adjustment of the radio transmitter that will reduce the difference between the theoretical target gain measurement and a subsequent actual gain measurement.

2. A method of controlling output power of a radio transmitter, the method comprising:

a) operating the radio transmitter at an initial output power level;

b) at a point in the radio transmitter downstream of a radio transmitter power amplifier, detecting a transmitted signal envelope of a radiofrequency signal occurring at a first time interval;

c) adjusting the detected transmitted signal envelope by an incremental amount;

d) ascertaining a first comparison value representing a power level comparison between the adjusted detected transmitted signal envelope and a source baseband signal envelope of a source baseband signal that corresponds to the signal occurring at the first time interval;

e) operating the radio transmitter at an adjusted output power level;

f) at a point in the radio transmitter downstream of the radio transmitter power amplifier, detecting a transmitted signal envelope of a radiofrequency signal occurring at a second time interval;

g) ascertaining a second comparison value representing a power level comparison between the detected transmitted signal envelope of the radiofrequency signal occurring at the second time interval and a source baseband signal envelope of a source baseband signal that corresponds to the radiofrequency signal occurring at the second time interval; and h) if the first comparison value and the second comparison value do not satisfy a predefined relationship with respect to one another, then predicting a further adjusted power level that will increase a likelihood that the first comparison value and the second comparison value will satisfy the predefined relationship with respect to one another, and operating the radio transmitter at the further adjusted output power level.

3. The method of claim 2, comprising:
ascertaining whether the adjusted detected signal power lies within a predefined range of values; and
performing steps d) through h) only if it is ascertained that the adjusted detected signal power lies within the predefined range of values.

4. The method of claim 2, wherein operating the radio transmitter at the further adjusted output power level comprises changing a gain control signal that controls gain of a modulator that is part of the radio transmitter.

5. The method of claim 2, wherein operating the radio transmitter at the further adjusted output power level comprises changing a gain control signal that controls a gain of the power amplifier of the radio transmitter.

6. The method of claim 2, wherein operating the radio transmitter at the further adjusted output power level comprises adjusting a gain level of a digital baseband signal to be transmitted by the radio transmitter.

7. The method of claim 2, wherein the first time interval occurs prior to the second time interval.

8. The method of claim 2, wherein ascertaining the first comparison value comprises averaging a plurality of comparison results.

9. The method of claim 2, wherein ascertaining the first comparison value comprises:
ensuring that an attribute associated with the adjusted detected transmitted signal envelope corresponds to an attribute of the source baseband signal prior to comparing the adjusted detected transmitted signal envelope with the source baseband signal.

10. The method of claim 2, wherein ascertaining the first comparison value comprises:

prior to comparing the adjusted detected transmitted signal envelope with the source baseband signal, delaying the baseband signal by an amount that ensures that the adjusted detected transmitted signal envelope corresponds to the source baseband signal.

11. An apparatus for controlling output power of a radio transmitter, the apparatus comprising:
circuitry configured to make a first output power measurement of a radiofrequency signal generated from a source baseband signal while operating the radio transmitter at an initial power level setting;
circuitry configured to adjust the first output power measurement by an incremental value;
circuitry configured to compare the adjusted output power measurement with a first measured power level of the source baseband signal to obtain a theoretical target gain measurement;
circuitry configured to adjust a power level setting of the radio transmitter;
circuitry configured to make a second output power measurement of the radio frequency signal generated from the source baseband signal while operating the radio transmitter at the adjusted power level setting;
circuitry configured to compare the second output power measurement with a second measured power level of the source baseband signal to obtain an actual gain measurement;
circuitry configured to ascertain a difference value representing a difference between the theoretical target gain measurement and the actual gain measurement; and
circuitry configured to use the ascertained difference value to determine a further power adjustment of the radio transmitter that will reduce the difference between the theoretical target gain measurement and a subsequent actual gain measurement.

12. An apparatus for controlling output power of a radio transmitter, the apparatus comprising:
a) circuitry configured to operate the radio transmitter at an initial output power level;
b) circuitry configured to detect a transmitted signal envelope of a radiofrequency signal occurring at a first time interval, wherein said detection is made at a point in the radio transmitter downstream of a radio transmitter power amplifier;
c) circuitry configured to adjust the detected transmitted signal envelope by an incremental amount;
d) circuitry configured to ascertain a first comparison value representing a power level comparison between the adjusted detected transmitted signal envelope and a source baseband signal envelope of a source baseband signal that corresponds to the signal occurring at the first time interval;
e) circuitry configured to operate the radio transmitter at an adjusted output power level;
f) circuitry configured to detect a transmitted signal envelope of a radiofrequency signal occurring at a second time interval, wherein said detection is made at a point in the radio transmitter downstream of the radio transmitter power amplifier;
g) circuitry configured to ascertain a second comparison value representing a power level comparison between the detected transmitted signal envelope of the radiofrequency signal occurring at the second time interval and a source baseband signal envelope of a source baseband signal that corresponds to the radiofrequency signal occurring at the second time interval; and h) circuitry configured to respond to the first comparison value and the second comparison value not satisfying a predefined relationship with respect to one another, said response including predicting a further adjusted power level that will increase a likelihood that the first comparison value and the second comparison value will satisfy the predefined relationship with respect to one another, and operating the radio transmitter at the further adjusted output power level.

13. The apparatus of claim 12, comprising:
circuitry configured to ascertain whether the adjusted detected signal power lies within a predefined range of values; and
circuitry configured to activate elements d) through h) only if it is ascertained that the adjusted detected signal power lies within the predefined range of values.

14. The apparatus of claim 12, wherein the circuitry configured to operate the radio transmitter at the further adjusted output power level comprises circuitry configured to change a gain control signal that controls gain of a modulator that is part of the radio transmitter.

15. The apparatus of claim 12, wherein the circuitry configured to operate the radio transmitter at the further adjusted output power level comprises circuitry configured to change a gain control signal that controls a gain of the power amplifier of the radio transmitter.

16. The apparatus of claim 12, wherein the circuitry configured to operate the radio transmitter at the further adjusted output power level comprises circuitry configured to adjust a gain level of a digital baseband signal to be transmitted by the radio transmitter.

17. The apparatus of claim 12, wherein the first time interval occurs prior to the second time interval.

18. The apparatus of claim 12, wherein the circuitry configured to ascertain the first comparison value comprises circuitry configured to average a plurality of comparison results.

19. The apparatus of claim 12, wherein the circuitry configured to ascertain the first comparison value comprises:
circuitry configured to ensure that an attribute associated with the adjusted detected transmitted signal envelope matches an attribute of the source baseband signal prior to comparing the adjusted detected transmitted signal envelope with the source baseband signal.

20. The apparatus of claim 12, wherein the circuitry configured to ascertain the first comparison value comprises:
circuitry configured to delay the baseband signal by an amount that ensures that the adjusted detected transmitted signal envelope corresponds to the source baseband signal prior to comparing the adjusted detected transmitted signal envelope with the source baseband signal.

* * * * *